United States Patent
Ogiwara et al.

(10) Patent No.: US 11,615,840 B2
(45) Date of Patent: Mar. 28, 2023

(54) MEMORY DEVICE

(71) Applicant: Kioxia Corporation, Tokyo (JP)

(72) Inventors: Ryu Ogiwara, Yokohama Kanagawa (JP); Daisaburo Takashima, Yokohama Kanagawa (JP); Takahiko Iizuka, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 261 days.

(21) Appl. No.: 17/022,580

(22) Filed: Sep. 16, 2020

(65) Prior Publication Data
US 2021/0090647 A1 Mar. 25, 2021

(30) Foreign Application Priority Data
Sep. 19, 2019 (JP) .............................. JP2019-170312

(51) Int. Cl.
G11C 13/00 (2006.01)
G11C 11/00 (2006.01)
G11C 7/00 (2006.01)

(52) U.S. Cl.
CPC ........ *G11C 13/004* (2013.01); *G11C 13/0004* (2013.01); *G11C 13/0026* (2013.01); *G11C 13/0028* (2013.01); *G11C 13/0038* (2013.01); *G11C 13/0069* (2013.01)

(58) Field of Classification Search
CPC .............. G11C 13/004; G11C 13/0004; G11C 13/0026; G11C 13/0028; G11C 13/0038; G11C 13/0069
USPC ........................................................ 365/148
See application file for complete search history.

(56) References Cited

U.S. PATENT DOCUMENTS

| 7,145,824 B2 | 12/2006 | Bill |
| 10,210,930 B2 | 2/2019 | Nakayama |
| 2011/0032746 A1* | 2/2011 | Maejima ............... G11C 13/003 365/189.06 |

(Continued)

FOREIGN PATENT DOCUMENTS

| JP | H7-159426 A | 6/1995 |
| JP | 2008-533645 A | 8/2008 |

(Continued)

OTHER PUBLICATIONS

Junji Tominaga et al., "Electrical-field induced giant magnetoresistivity in (non-magnetic) phase change films", Applied Physics Letters (vol. 99), 2011, pp. (152105-1)-(152105-3).

*Primary Examiner* — Ly D Pham
(74) *Attorney, Agent, or Firm* — Foley & Lardner LLP (57) ABSTRACT

According to one embodiment, a memory device includes a memory cell including a resistance change memory element in which a plurality of data values according to resistance are allowed to be set, and a selector element connected to the resistance change memory element in series, a word line supplying a select signal for selecting the resistance change memory element by the selector element to the memory cell, a bit line to which a data signal according to a data value set in the resistance change memory element is read, a load circuit connected to the memory cell in series and functioning as a load, and a comparator circuit which compares a voltage obtained by the load circuit with a plurality of reference voltages.

16 Claims, 13 Drawing Sheets

(56) References Cited

U.S. PATENT DOCUMENTS

| | | | |
|---|---|---|---|
| 2011/0051492 A1* | 3/2011 | Toda | G11C 13/004 |
| | | | 365/189.09 |
| 2018/0268878 A1 | 9/2018 | Ogiwara | |
| 2018/0268898 A1 | 9/2018 | Suzuki | |
| 2020/0303001 A1 | 9/2020 | Ogiwara et al. | |

FOREIGN PATENT DOCUMENTS

| | | |
|---|---|---|
| JP | 4642895 B2 | 3/2011 |
| JP | 2018-156700 A | 10/2018 |
| JP | 2018-156701 A | 10/2018 |
| JP | 6398090 B2 | 10/2018 |
| JP | 2020-155183 A | 9/2020 |
| WO | WO 2015/125473 A1 | 8/2015 |

\* cited by examiner

MEMORY DEVICE

CROSS-REFERENCE TO RELATED APPLICATIONS

This application is based upon and claims the benefit of priority from Japanese Patent Application No. 2019-170312, filed Sep. 19, 2019, the entire contents of which are incorporated herein by reference.

FIELD

Embodiments described herein relate generally to a memory device.

BACKGROUND

A memory device (semiconductor integrated circuit device) in which a resistance change memory element such as a phase change memory (PCM) element or an interfacial phase change memory (iPCM) element is integrated on a semiconductor substrate is suggested.

When multi-level memory is to be realized in a memory device using resistance change memory elements as described above, an appropriate method is not necessarily suggested.

DETAILED DESCRIPTION

In general, according to one embodiment, a memory device includes: a memory cell including a resistance change memory element in which a plurality of data values according to resistance are allowed to be set, and a selector element connected to the resistance change memory element in series; a word line which supplies a select signal for selecting the resistance change memory element by the selector element to the memory cell; a bit line to which a data signal according to a data value set in the resistance change memory element selected by the selector element is read from the memory cell; a load circuit connected to the memory cell in series and functioning as a load for the resistance change memory element; and a comparator circuit which compares a voltage obtained by the load circuit with a plurality of reference voltages.

Embodiments will be described hereinafter with reference to the accompanying drawings.

Figure 1:
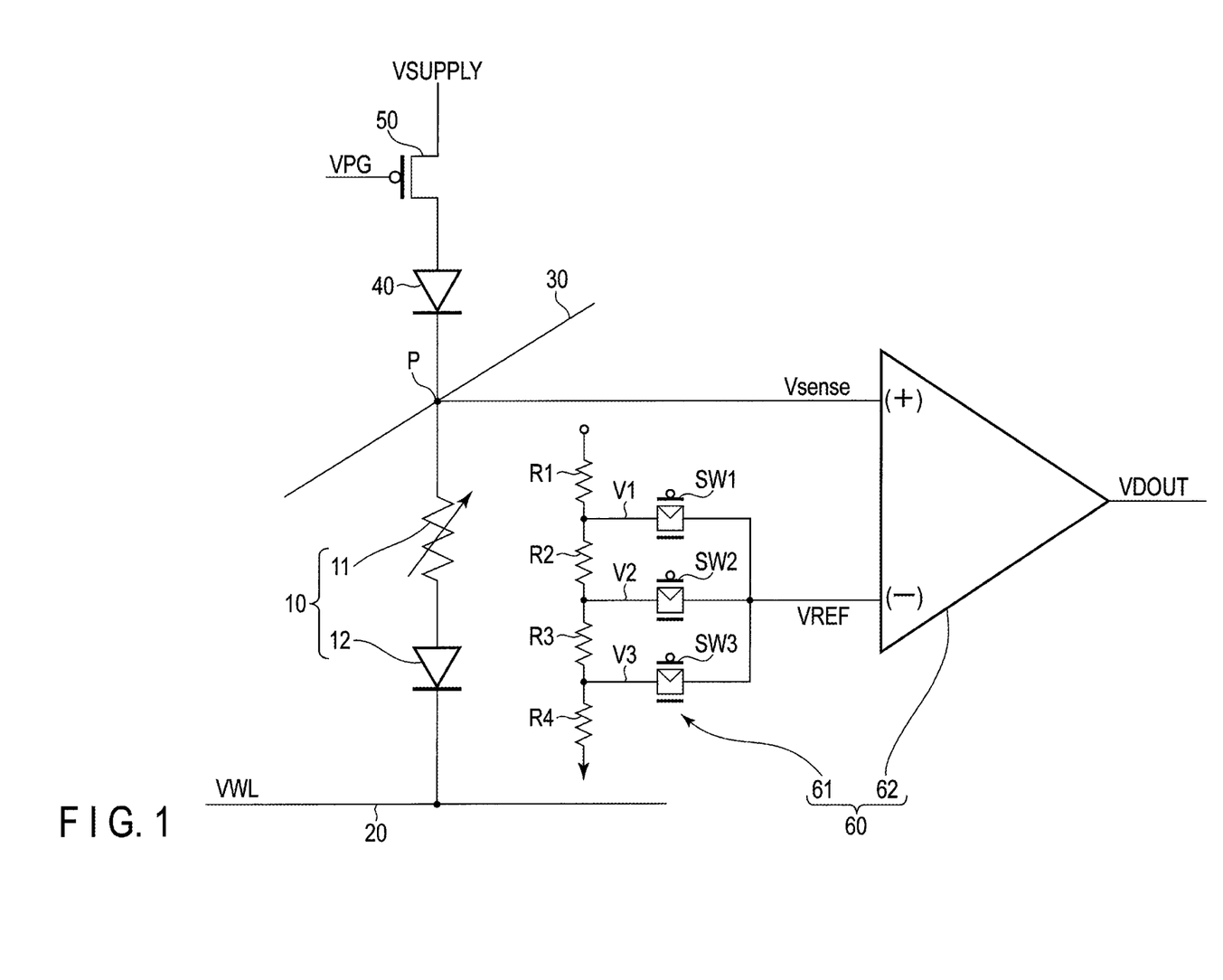
FIG. 1 is a circuit diagram showing the structure of a memory device according to an embodiment.

FIG. 1 is a circuit diagram showing the structure of a memory device according to an embodiment.

The memory device of the present embodiment comprises a memory cell 10, a word line 20, a bit line 30, a load circuit (load element) 40, a switch circuit (switch element) 50 and a comparator circuit 60. Specifically, a plurality of memory cells 10 are provided at the respective intersections between a plurality of word lines 20 and a plurality of bit lines 30.

The memory cell 10 includes a resistance change memory element 11 in which a plurality of data values according to resistance are allowed to be set, and a selector element 12 connected to the resistance change memory element 11 in series.

A resistance change memory element in which a plurality of resistance states are allowed to be set can be used for the resistance change memory element 11. Specifically, for the resistance change memory element 11, for example, a phase change memory (PCM) element, an interfacial phase change memory (iPCM) element, a resistive random access memory (ReRAM) element or a conductive bridge random access memory (CBRAM) element can be used.

The selector element 12 selects the resistance change memory element 11. For the selector element 12, a two-terminal element or a three-terminal element is used. In the example shown in FIG. 1, a diode which is a two-terminal element is used for the selector element 12.

The word line 20 is connected to the memory cell 10. A select signal for selecting the resistance change memory element 11 by the selector element (diode) 12 is supplied to the memory cell 10 via the word line 20. When a select signal VWL is supplied to the word line 20, the diode (selector element 12) transitions to an on-state, and the resistance change memory element 11 is selected. As a result, writing or reading can be performed with respect to the resistance change memory element 11.

The bit line 30 in which a data signal according to the data value set in the resistance change memory element 11 is read from the memory cell 10 is connected to the memory cell 10. In other words, when the memory cell 10 is selected as described above, writing or reading can be performed with respect to the selected memory cell 10 via the bit line 30 connected to the selected memory cell 10.

A load circuit 40 connected to the memory cell 10 in series and functioning as a load for the resistance change memory element 11 is connected to the bit line 30. The load circuit 40 is structured by a load element having a nonlinear current-voltage characteristic. Specifically, the load circuit (load element) 40 has a logarithmic current-voltage characteristic. In other words, the load circuit (load element) 40 has a current-voltage characteristic in which current is exponentially increased with respect to the applied voltage.

In the example shown in FIG. 1, for the load element 40, a two-terminal element having a nonlinear current-voltage characteristic is used. For the two-terminal element, a diode or a desired selector can be used. The selector has a relationship in which current nonlinearly changes with respect to the voltage applied between two terminals. Specifically, when the voltage applied between two terminals exceeds a certain voltage, current steeply (for example, exponentially) increases with respect to the applied voltage.

As the switch circuit (switch element) 50, a PMOS transistor is connected to the load element 40. When the PMOS transistor (switch element 50) is turned on by signal VPG, current can be supplied to the load element 40 and the memory cell 10.

The comparator circuit 60 is connected to the connection point P of the memory cell 10, the bit line 30 and the load element 40. In the comparator circuit 60, the voltage obtained by the load circuit (load element) 40 (in other words, the voltage of the connection point P) is compared with a plurality of reference voltages VREF. The comparator circuit 60 includes a reference voltage generation circuit block 61 and an operational amplifier 62.

The reference voltage generation circuit block 61 generates a plurality of reference voltages, and includes a voltage dividing circuit including a plurality of resistors R1, R2, R3 and R4 connected in series, and a switch circuit including a plurality of switch elements SW1, SW2 and SW3. By turning on one of switch elements SW1, SW2 and SW3, one of voltages V1, V2 and V3 obtained by the voltage dividing circuit is applied to the inverting input terminal of the operational amplifier 62 as reference voltage VREF.

Voltage Vsense of the connection point P is input to the non-inverting input terminal of the operational amplifier 62. In the operational amplifier 62, voltage Vsense input to the non-inverting input terminal is compared with the reference voltage (voltage V1, V2 or V3) input to the inverting input terminal, and an output signal (output voltage VDOUT) based on the result of comparison is output from an output terminal.

In the present embodiment, as described above, the load circuit (load element) 40 which functions as a load for the resistance change memory element 11 and has a nonlinear current-voltage characteristic is provided. By this structure, appropriate multi-level memory can be realized. Additional explanation is provided below.

Figure 2:
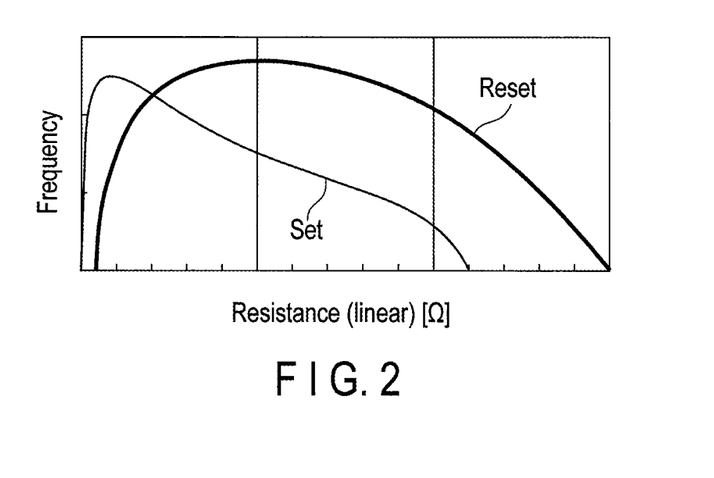
FIG. 2 is a diagram schematically showing the frequency distribution of the resistance of a resistance change memory element when a PCM element or an iPCM element is used for the resistance change memory element.

FIG. 2 is a diagram schematically showing the frequency distribution of the resistance of the resistance change memory element when a PCM element or an iPCM element is used as for resistance change memory element. The horizontal axis shows resistance, and the vertical axis shows a frequency (appearance frequency). The horizontal axis (resistance) is shown by a linear scale. In general, a PCM element and an iPCM element have two states, specifically, a low-resistance state (set state) and a high-resistance state (reset state). FIG. 2 schematically shows the frequency distribution of the resistance when set writing is performed and the frequency distribution of the resistance when reset writing is performed.

Figure 3:
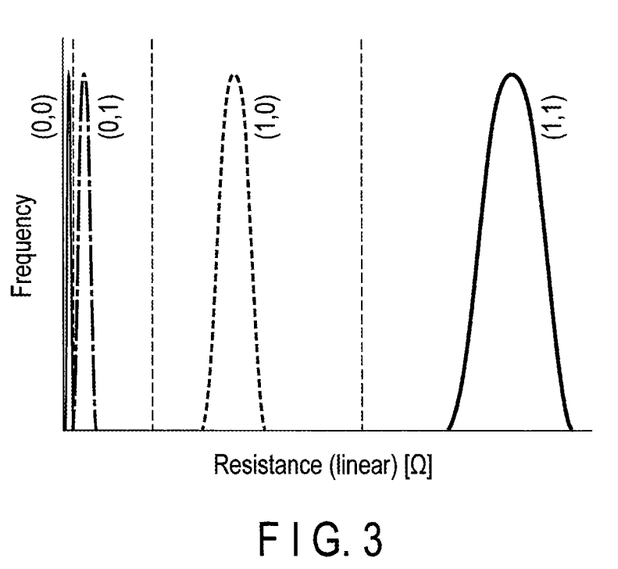
FIG. 3 is a diagram schematically showing the characteristics of resistance distribution when multi-level memory is to be realized using the resistance change memory element having the characteristics of frequency distribution shown in FIG. 2.

When multi-level memory is to be realized using the resistance change memory element having the characteristics of resistance distribution shown in FIG. 2, the characteristics of resistance distribution shown in FIG. 3 are considered to be obtained. Specifically, when multi-level memory is to be realized by repeating writing and verifying until the resistance of the resistance change memory element is set in a resistance range corresponding to a desired data value (in the example of FIG. 3, (0, 0), (0, 1), (1, 0) or (1, 1)), the characteristics of resistance distribution shown in FIG. 3 are considered to be obtained. In such characteristics of resistance distribution, on the low resistance side, a margin between distributions is extremely narrow, and further, the difference in potential between reference potentials is extremely narrow. Thus, it is difficult to accurately perform read operation.

Figure 4:
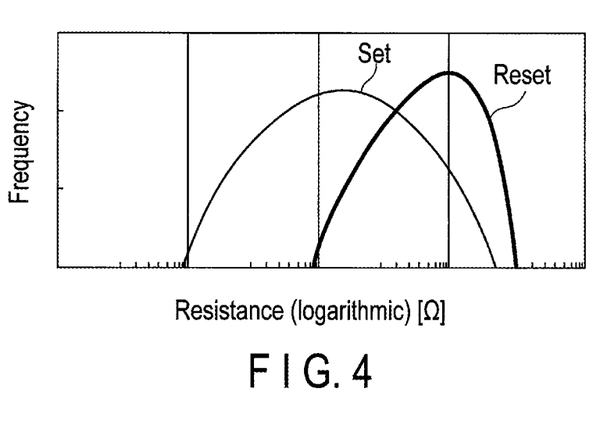
FIG. 4 is a diagram in which resistance is shown by a logarithmic scale with respect to the frequency distribution of resistance shown in FIG. 2.

In FIG. 4, with respect to the characteristics of resistance distribution of FIG. 2, the horizontal axis (resistance) is shown by a logarithmic scale. As shown in FIG. 4, when the horizontal axis (resistance) is shown by a logarithmic scale, the characteristics of resistance distribution (frequency distribution) seem to be averaged compared with the case of FIG. 2 in which the horizontal axis (resistance) is a linear scale.

Figure 5:
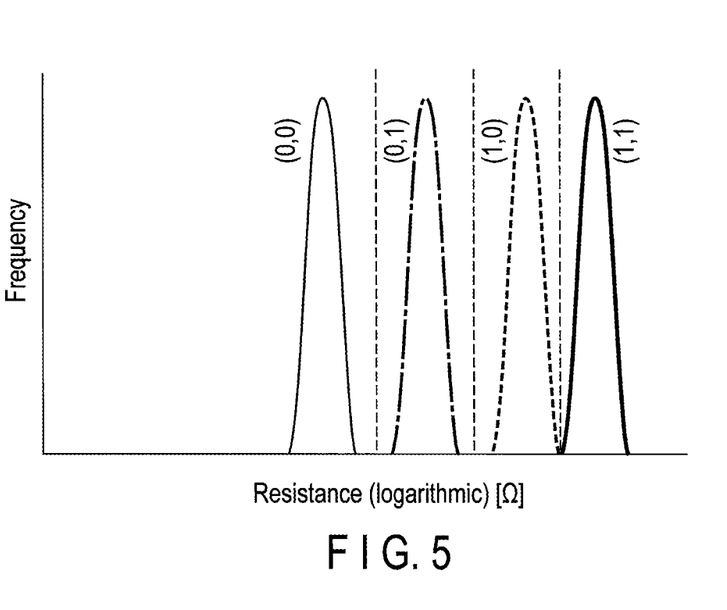
FIG. 5 is a diagram schematically showing the characteristics of resistance distribution when multi-level memory is to be realized using the resistance change memory element having the characteristics of frequency distribution shown in FIG. 4.

When the horizontal axis is shown by a logarithmic scale, the characteristics of resistance distribution of multi-level memory shown in FIG. 3 are considered to become those shown in FIG. 5. The resistance range of the characteristics of resistance distribution (a resistance range corresponding to each of data values (0, 0), (0, 1), (1, 0) and (1, 1)) is averaged.

To realize the above matters, in the present embodiment, the load circuit (load element) 40 which functions as a load for the resistance change memory element 11 and has a nonlinear current-voltage characteristic is provided.

Figure 6A:
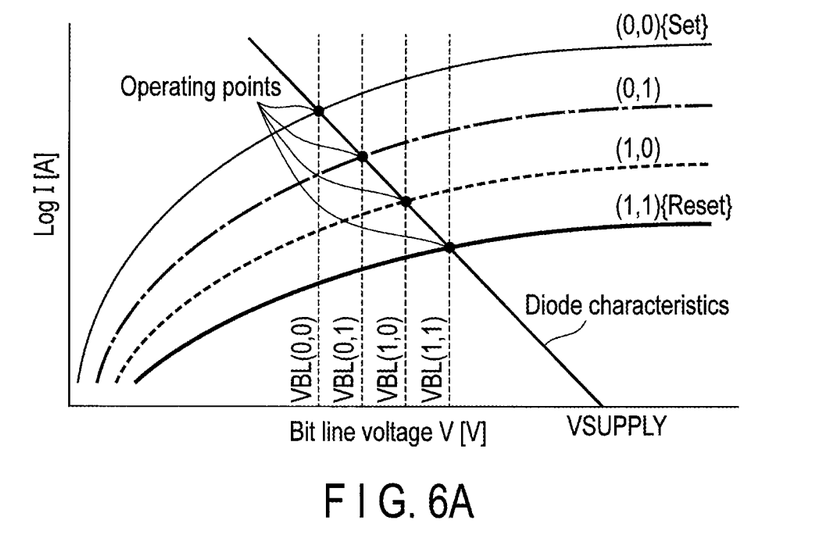
FIG. 6A is a diagram showing an example of operating points when a diode is used for a load element in the memory device according to the embodiment.

FIG. 6A is a diagram showing operating points when a diode is used for the load element 40. The horizontal axis (linear scale) shows bit line voltage (the voltage of the connection point P). The vertical axis (logarithmic scale) shows the current flowing through the diode (load element 40) and the resistance change memory element 11.

The diode used for the load element 40 has a logarithmic current-voltage characteristic. In other words, the diode has a current-voltage characteristic in which current is exponentially increased with respect to the applied voltage. Therefore, when the vertical axis is shown by a logarithmic scale, the diode characteristic is linear, and the operating point voltages ($V_{BL(0,\ 0)}$, $V_{BL(0,\ 1)}$, $V_{BL(1,\ 0)}$ and $V_{BL(1,\ 1)}$) in the resistance of the resistance change memory element 11 (resistance corresponding to each of data values (0, 0), (0, 1), (1, 0) and (1, 1)) are distributed at an equal interval, in the horizontal linear scale.

As stated above, when the load element 40 having a nonlinear current-voltage characteristic is used for the load for the resistance change memory element 11, reference voltages V1, V2 and V3 of the comparator circuit 60 can be distributed at an equal interval, and comparison operation can be accurately performed. Thus, the present embodiment can realize a nonvolatile memory device which is allowed to accurately perform read operation and appropriately perform multi-level memory.

As the load element 40 is used for the load for the resistance change memory element 11 in the present embodiment, stable circuit operation can be realized. For example, when the load element 40 is used for a circuit comprising an operational amplifier and a feedback path, the circuit operation might become unstable by oscillation, etc. As the load element 40 is used for the load for the resistance change memory element 11 in the present embodiment, the above problem can be avoided, and stable circuit operation can be realized.

Figure 6B:
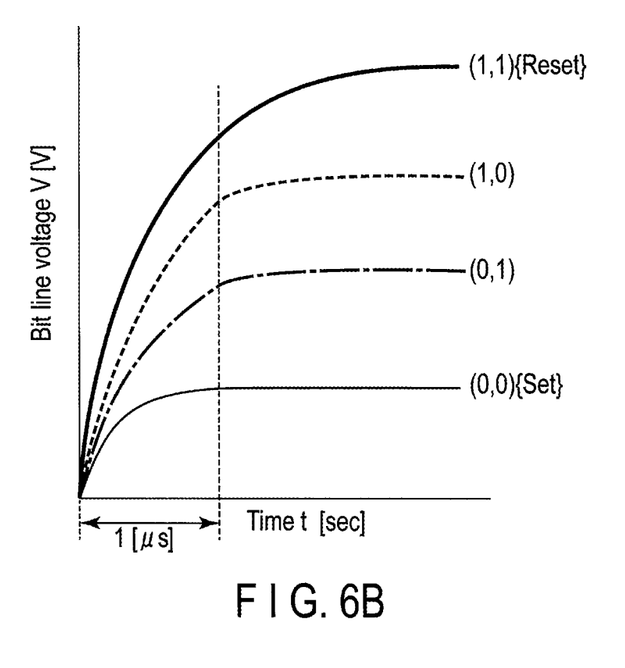
FIG. 6B is a diagram showing an example of a temporal change in bit line voltage in the memory device according to the embodiment and corresponds to the distribution of resistance of FIG. 6A.

FIG. 6B shows a temporal change in bit line voltage (the voltage of the connection point P). The horizontal axis (linear scale) shows time. The vertical axis (linear scale) shows bit line voltage (the voltage of the connection point P).

In the example shown in FIG. 6B, the time until the bit line voltage reaches a constant value (saturation value) is longer as the resistance of the resistance change memory element 11 (resistance corresponding to data values (0, 0), (0, 1), (1, 0) and (1, 1)) is higher. After the bit line voltage reaches a constant value (saturation value), intervals between bit line voltages are almost the same. Thus, high-speed operation is difficult. To realize high-speed operation, at a time point (for example, at the time point of 1 µs) before the bit line voltage reaches a constant value (saturation value), the bit line voltage (voltage Vsense of the connection point P) should be preferably compared with reference voltage VREF. In other words, in the comparator circuit 60, the bit line voltage should be preferably compared with reference voltage VREF in a transition period before the bit line voltage reaches a constant value. However, in the case of the characteristics shown in FIG. 6A and FIG. 6B, it is difficult to equalize the interval between bit line voltages in a transition period before the bit line voltage reaches a constant value.

Figure 7A:
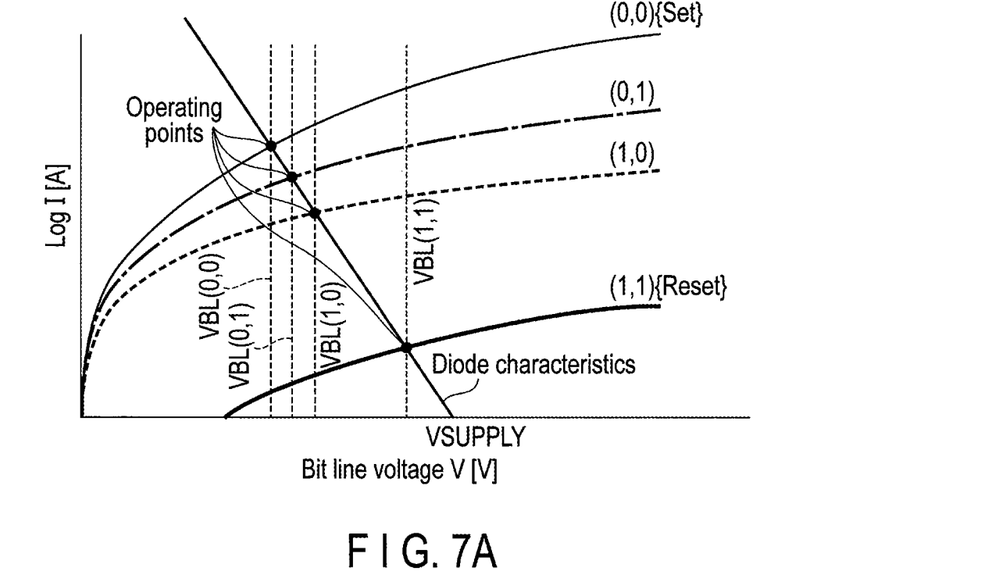
FIG. 7A is a diagram showing another example of operating points when a diode is used for the load element in the memory device according to the embodiment.
Figure 7B:
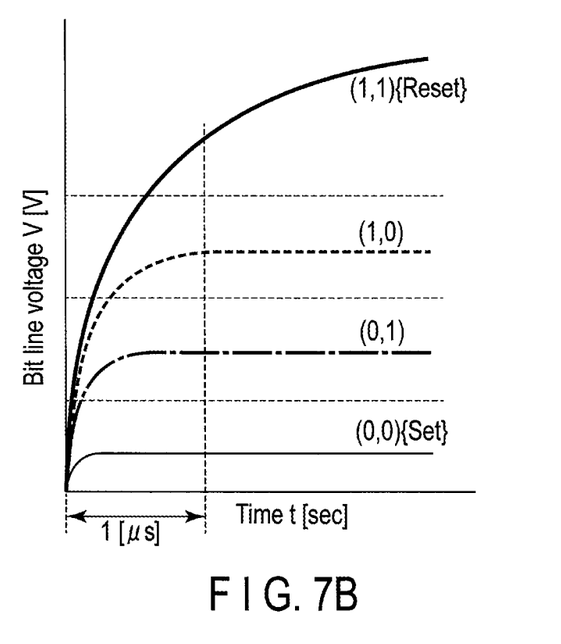
FIG. 7B is a diagram showing another example of a temporal change in bit line voltage in the memory device according to the embodiment and corresponds to the distribution of resistance of FIG. 7A.

To equalize the interval between bit line voltages at a time point (for example, at the time point of 1 µs) before the bit line voltage reaches a constant value (saturation value), the characteristics shown in FIG. 7A are obtained by verify operation after write operation. By adopting these characteristics, as shown in FIG. 7B, the interval between bit line voltages can be equalized at a time point (for example, at the time point of 1 µs) before the bit line voltage reaches a constant value (saturation value).

Now, this specification explains various modified examples of the present embodiment.

Figure 8:
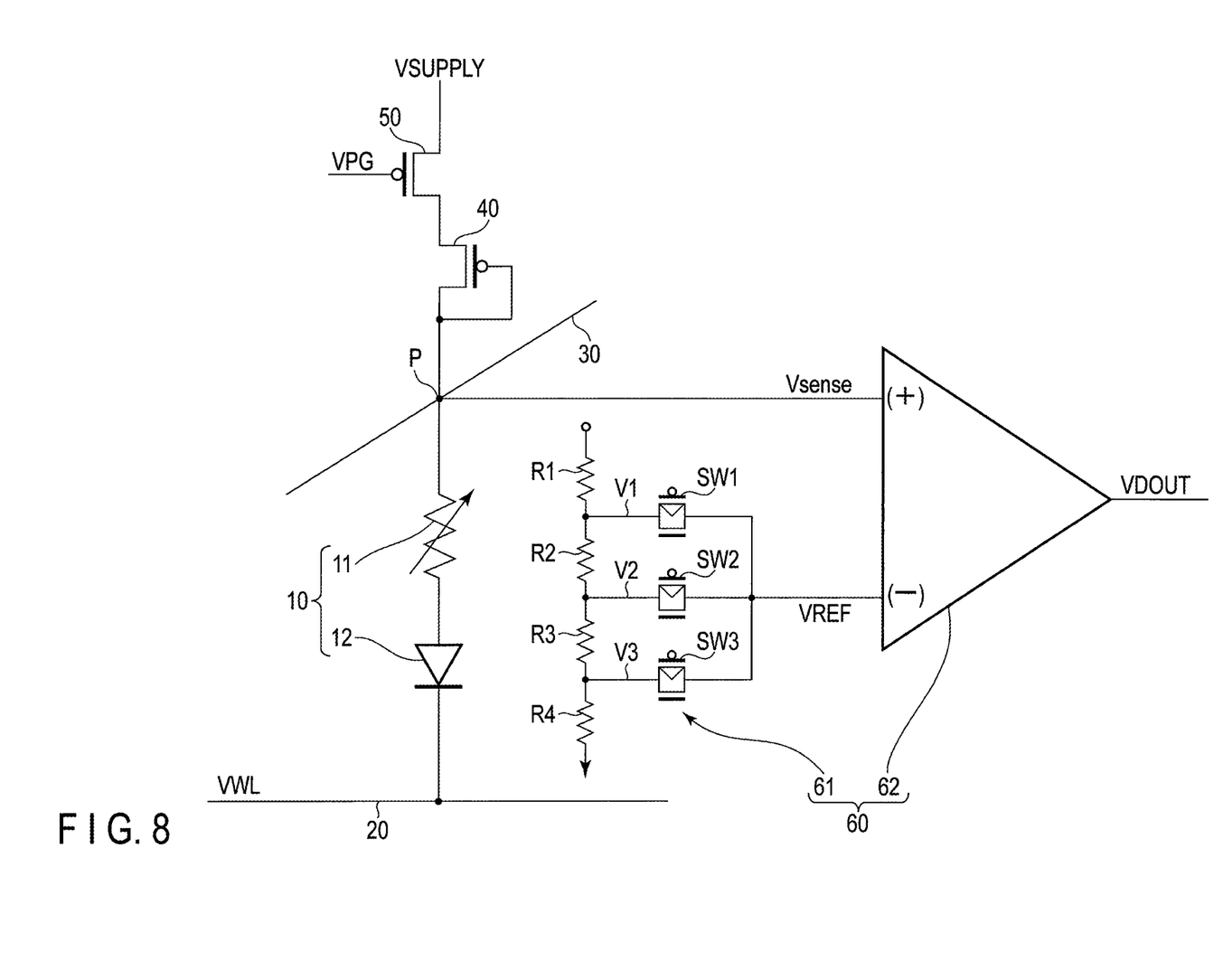
FIG. 8 is a circuit diagram showing the structure of the first modified example of the memory device according to the embodiment.

FIG. 8 is a circuit diagram schematically showing the structure of the first modified example of the memory device according to the present embodiment. In this structural example, a diode-connected three-terminal element is used for the load element 40. Specifically, a PMOS transistor in which a gate and a drain are connected is used for the load element 40. Even when this structure is employed, operation similar to that of the above embodiment can be realized, and an effect similar to that of the above embodiment can be obtained.

Figure 9:
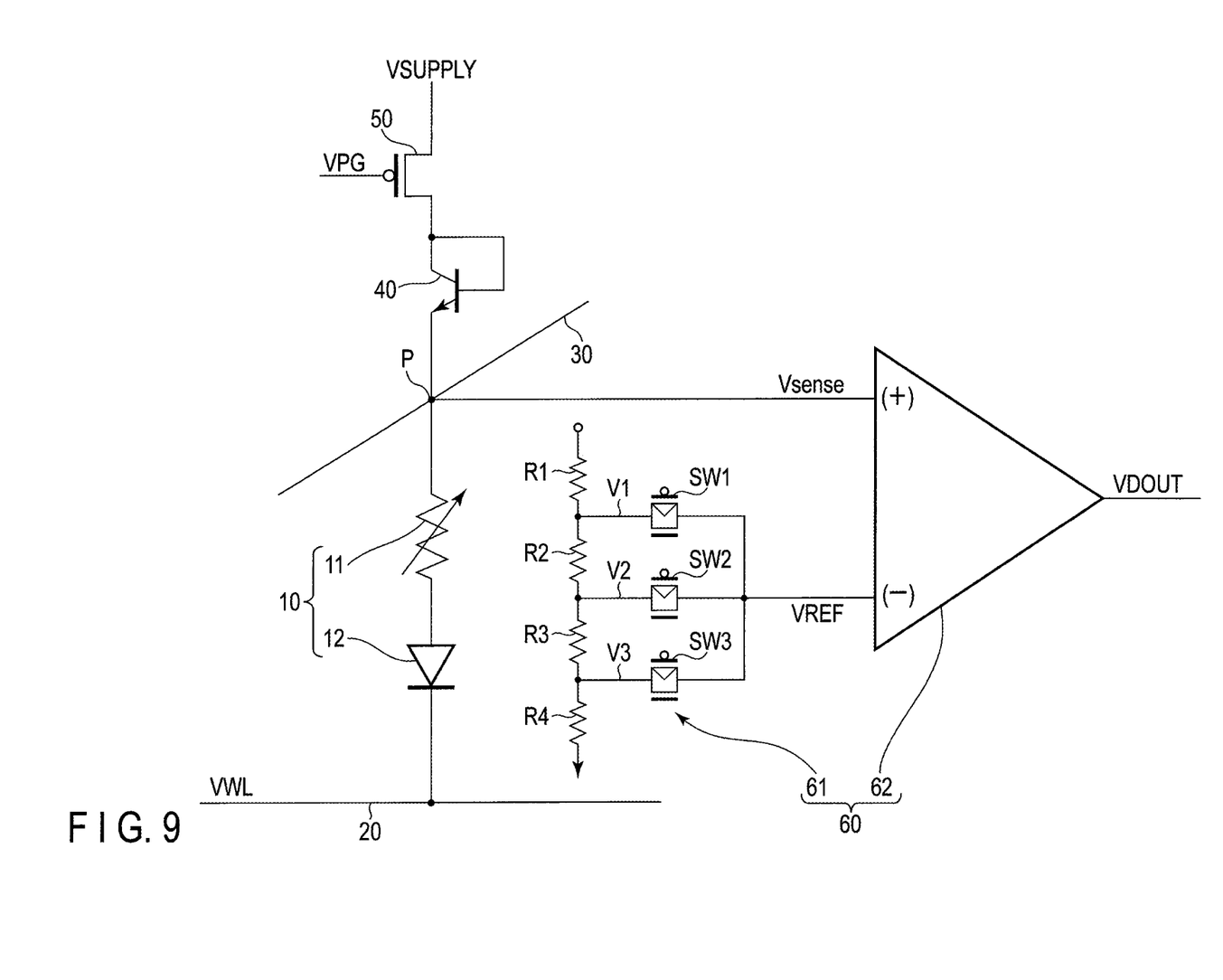
FIG. 9 is a circuit diagram showing the structure of the second modified example of the memory device according to the embodiment.

FIG. 9 is a circuit diagram schematically showing the structure of the second modified example of the memory device according to the present embodiment. In this structural example, similarly, a diode-connected three-terminal element is used for the load element 40. Specifically, a bipolar transistor in which a base and a collector are connected is used for the load element 40. Even when this structure is employed, operation similar to that of the above embodiment can be realized, and an effect similar to that of the above embodiment can be obtained.

Figure 10:
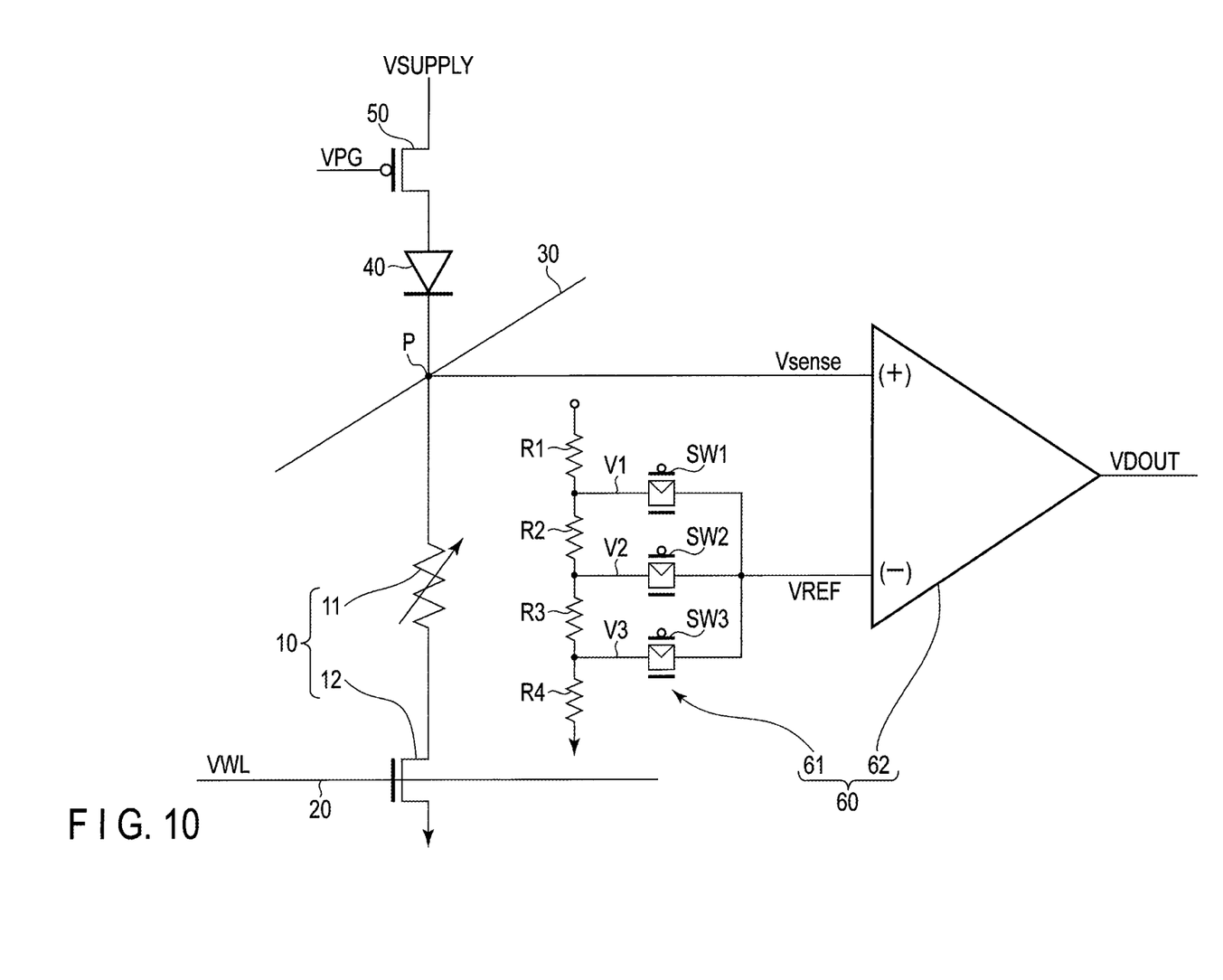
FIG. 10 is a circuit diagram showing the structure of the third modified example of the memory device according to the embodiment.

FIG. 10 is a circuit diagram schematically showing the structure of the third modified example of the memory device according to the present embodiment. In this structural example, a three-terminal element is used for the selector element 12. Specifically, a MOS transistor is used for the selector element 12. In this modified example, the word line 20 is connected to the gate of the MOS transistor (selector element 12). When the MOS transistor (selector element 12) transitions to an on-state by supplying a select signal VWL to the word line 20, the resistance change memory element 11 connected to the MOS transistor (selector element 12) is selected, and writing or reading can be performed with respect to the resistance change memory element 11.

Figure 11:
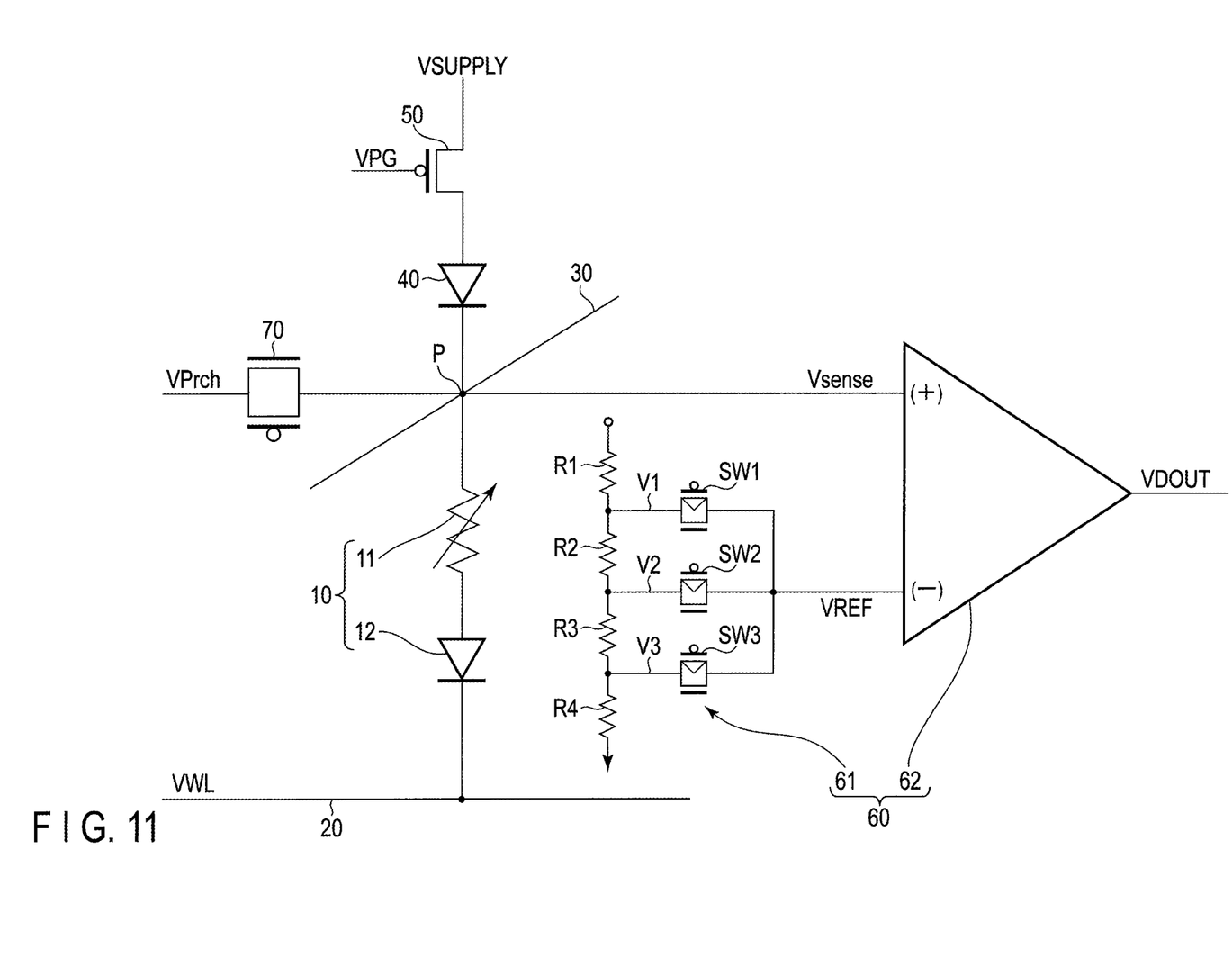
FIG. 11 is a circuit diagram showing the structure of the fourth modified example of the memory device according to the embodiment.

FIG. 11 is a circuit diagram schematically showing the structure of the fourth modified example of the memory device according to the present embodiment. In the above embodiment, bit line potential (the potential of the connection point P) is ground potential in the initial state of comparison operation. However, in this modified example, precharge is performed such that the potential of the bit line 30 (connection point P) is predetermined potential in the initial state of comparison operation. In this modified example, a precharge switch (precharge transistor) 70 is connected to the connection point P. Precharge is performed such that the potential of the bit line 30 (connection point P) becomes predetermined potential by the precharge switch 70.

Figure 12:
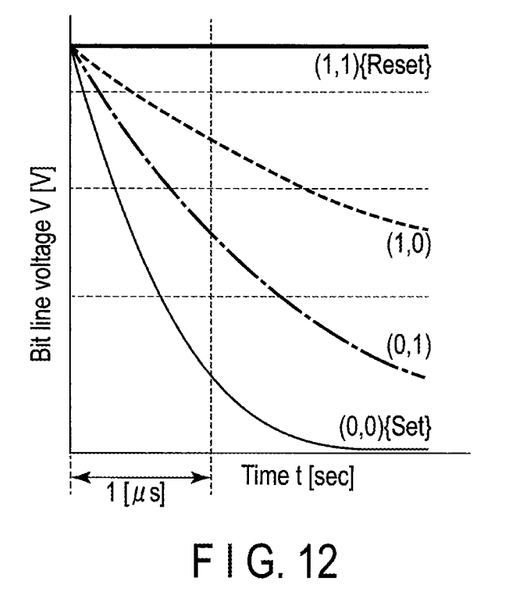
FIG. 12 is a diagram showing a temporal change in bit line voltage in the fourth modified example of the memory device according to the embodiment.

FIG. 12 is a diagram showing a temporal change in bit line voltage (the voltage of the connection point P) in the present modified example. The horizontal axis (linear scale) shows time. The vertical axis (linear scale) shows bit line voltage (the voltage of the connection point P). In this modified example, precharge is performed such that the potential of the bit line 30 (connection point P) is predetermined potential. Thus, the potential of the bit line 30 (connection point P) is decreased as the time passes. In this modified example, in a manner similar to that of the above embodiment, bit line voltage (voltage Vsense) can be compared with reference voltage VREF at a time point (in the example of FIG. 12, at the time point of 1 µs) before bit line voltage reaches a constant value (saturation value). In other words, bit line voltage can be compared with reference voltage VREF in a transition period before bit line voltage reaches a constant value (saturation value).

Figure 13:
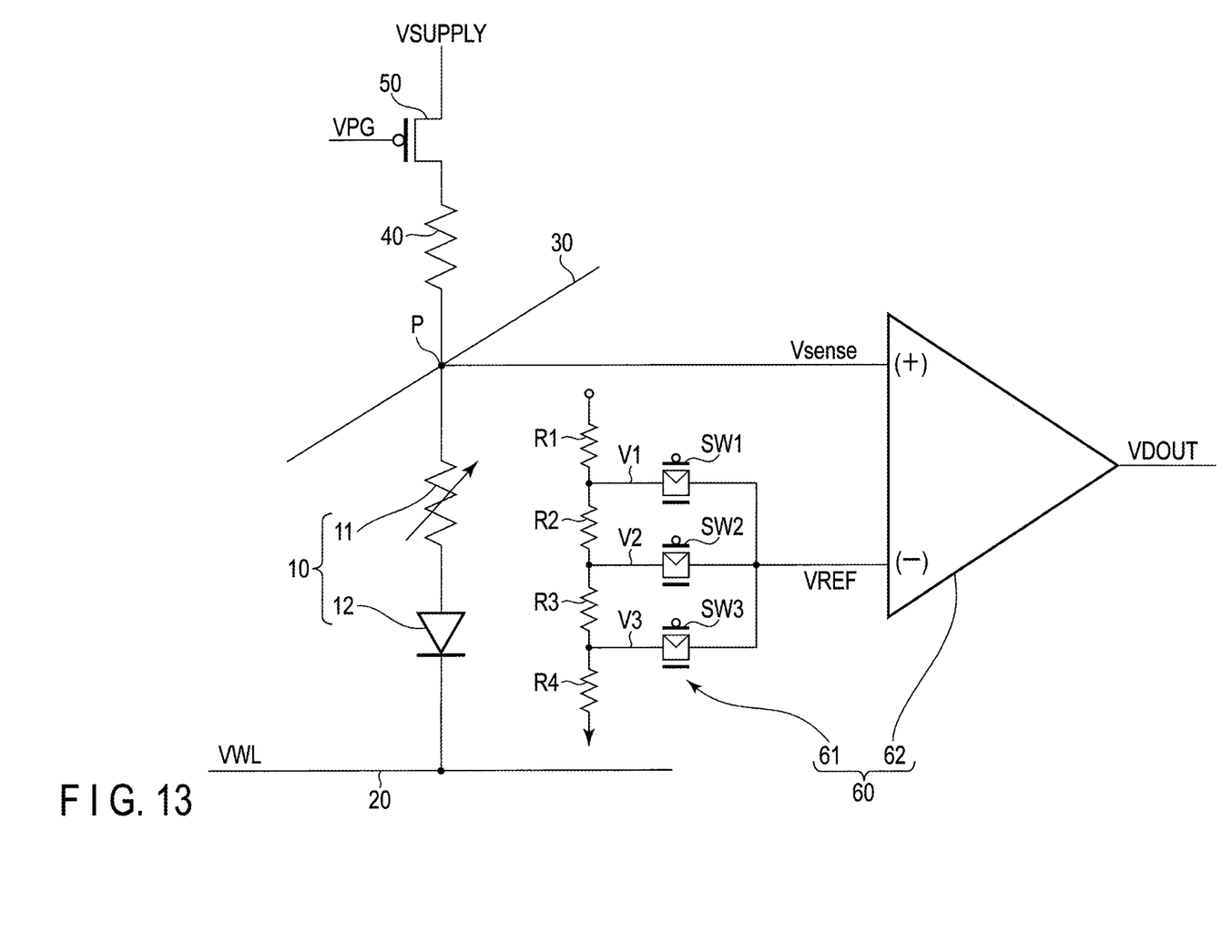
FIG. 13 is a circuit diagram showing the structure of the fifth modified example of the memory device according to the embodiment.
Figure 14:
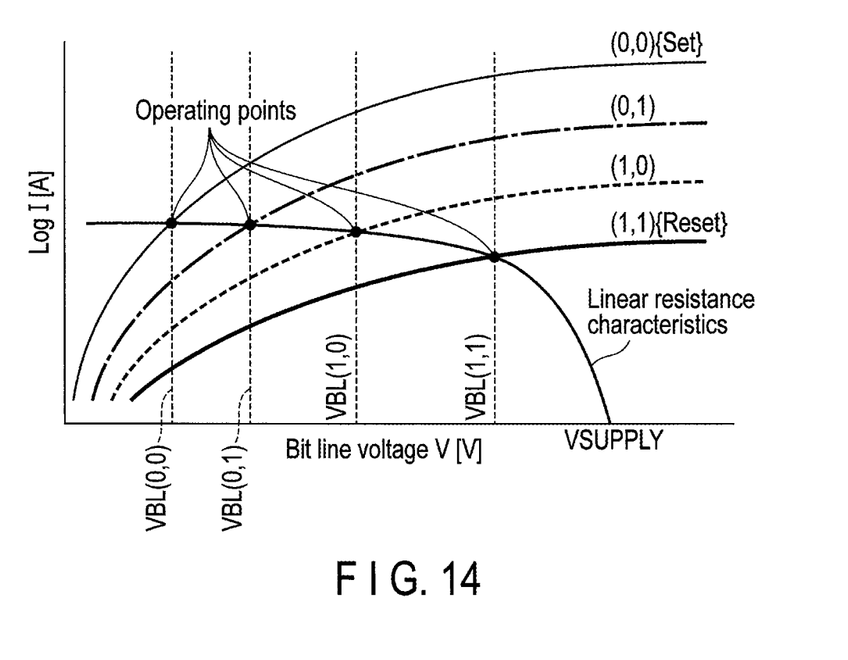
FIG. 14 is a diagram showing operating points when resistor is used for the load element according to the memory device corresponding to the fifth modified example of FIG. 13.

FIG. 13 is a circuit diagram showing the structure of the fifth modified example of the memory device according to the present embodiment. In the above embodiment, the load element 40 having a nonlinear current-voltage characteristic is used. However, in this modified example, the load element 40 having a linear current-voltage characteristic is used. Specifically, a resistor element is used for the load element 40. Thus, even when a resistor element having a linear current-voltage characteristic is used for the load element 40, in a manner similar to that of the above embodiment, it is possible to avoid the unstable operation of the circuit caused by oscillation, etc., and realize stable circuit operation. In this modified example, the linear resistance characteristics and operating points shown in FIG. 14 can be obtained.

It is possible to adopt a structure obtained by appropriately combining the above embodiment and first to fifth modified examples.

In the above embodiment and first to fifth modified examples, the reference voltage generation circuit block 61 included in the comparator circuit 60 generates reference voltage by simply applying resistive division to the voltage of the power source. However, since a diode, a MOS transistor and a bipolar transistor have temperature dependence, reference voltage should preferably also have temperature dependence.

Figure 15:
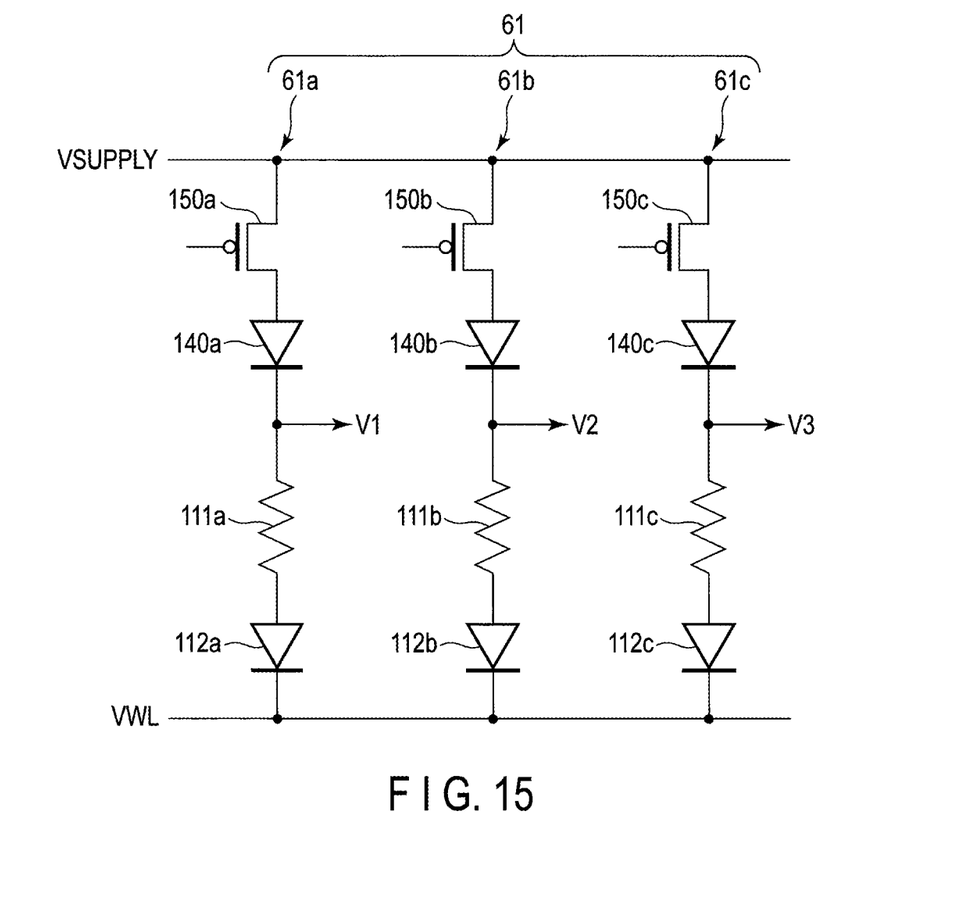
FIG. 15 is a circuit diagram showing the structure of a modified example of the reference voltage generation circuit block of the memory device according to the embodiment.

FIG. 15 is a circuit diagram schematically showing the structure of a modified example of the reference voltage generation circuit block 61. In this modified example, the reference voltage generation circuit block 61 is configured to generate reference voltage having temperature dependence.

As shown in FIG. 15, the reference voltage generation circuit block 61 includes a plurality of reference voltage generation circuits 61a, 61b and 61c.

Reference voltage generation circuit 61a includes a reference resistor element 111a, a reference selector element 112a, a reference load element 140a and a reference switch element 150a. Similarly, reference voltage generation circuit 61b includes a reference resistor element 111b, a reference selector element 112b, a reference load element 140b and a reference switch element 150b. Reference voltage generation circuit 61c includes a reference resistor element 111c, a reference selector element 112c, a reference load element 140c and a reference switch element 150c.

Each of the above reference voltage generation circuits 61a, 61b and 61c has the same circuit structure and the same circuit characteristics as those of the circuit (the circuit including the resistance change memory element 11, the selector element 12, the load element 40 and the switch element 50) shown in FIG. 1. One of reference voltages V1, V2 and V3 generated in reference voltage generation circuits 61a, 61b and 61c is applied to the inverting input terminal of the operational amplifier 62 shown in FIG. 1 via corresponding switch element SW1, SW2 or SW3 shown in FIG. 1.

In the above structure, the resistance of reference resistor element 111a is defined as Ra, and the resistance of reference resistor element 111b is defined as Rb, and the resistance of reference resistor element 111c is defined as Rc. In the characteristics of resistance distribution of the resistance change memory element 11 shown in FIG. 1, the resistance of the center of a resistance distribution characteristic portion corresponding to data value (0, 0) is defined as $R_{(0, 0)}$. The resistance of the center of a resistance distribution characteristic portion corresponding to data value (0, 1) is defined as $R_{(0, 1)}$. The resistance of the center of a resistance distribution characteristic portion corresponding to data value (1, 0) is defined as $R_{(1, 0)}$. The resistance of the center of a resistance distribution characteristic portion corresponding to data value (1, 1) is defined as $R_{(1, 1)}$.

In this case, reference resistance Ra, reference resistance Rb and reference resistance Rc are set so as to satisfy the following formulae:

$$\log Ra = (\log R_{(1,1)} + \log R_{(1,0)})/2$$

$$\log Rb = (\log R_{(1,0)} + \log R_{(0,1)})/2$$

$$\log Rc = (\log R_{(0,1)} + \log R_{(0,0)})/2$$

By setting the reference resistance as described above, even when the temperature is changed, a sufficient margin can be ensured. In other words, even when the temperature is changed, in FIG. 5 (logarithmic scale), resistance Ra of reference resistor element 111a can be located in the middle point between resistance $R_{(1, 1)}$ of the center of a resistance distribution characteristic portion corresponding to data value (1, 1) and resistance $R_{(1, 0)}$ of the center of a resistance distribution characteristic portion corresponding to data value (1, 0). Resistance Rb of reference resistor element 111b can be located in the middle point between resistance $R_{(1, 0)}$ of the center of a resistance distribution characteristic portion corresponding to data value (1, 0) and resistance $R_{(0, 1)}$ of the center of a resistance distribution characteristic portion corresponding to data value (0, 1). Resistance Rc of reference resistor element 111c can be located in the middle point between resistance $R_{(0, 1)}$ of the center of a resistance distribution characteristic portion corresponding to data value (0, 1) and resistance $R_{(0, 0)}$ of the center of a resistance distribution characteristic portion corresponding to data value (0, 0).

When the above relationships are generalized, the following formula is satisfied:

$$\log R_{refx-x+1} (\log R_x + \log R_{x+1})/2$$

where x is a positive integer, and the resistance of the center of the $x^{th}$ resistance distribution characteristic portion from the lowest resistance is Rx, and the resistance of the center of the $x+1^{th}$ resistance distribution characteristic portion is $R_{x+1}$, and the resistance of the reference resistor element having resistance between resistance $R_x$ and resistance $R_{x+1}$ is $R_{refx-x+1}$.

In the above modified example of the reference voltage generation circuit block 61, a circuit structure corresponding to the circuit (the circuit including the resistance change memory element 11, the selector element 12, the load element 40 and the switch element 50) shown in FIG. 1 is used. When the circuits shown in the first to fifth modified examples are used, similarly, circuit structures corresponding to the circuits shown in the first to fifth modified examples (each circuit including the resistance change memory element 11, the selector element 12, the load element 40 and the switch element 50) are used for the reference voltage generation circuit block 61. In other words, a circuit structure corresponding to the circuit including the resistance change memory element 11, the selector element 12, the load element 40 and the switch element 50 is used for the reference voltage generation circuit block 61.

When the multi-level memory stated in the above embodiment and modified examples is executed, the multi-level memory may be executed by repeating writing and verifying using a pulse shape, or the multi-level memory can be executed by performing writing using a plurality of pulse shapes.

In the above embodiment and modified examples, a PCM element or an iPCM element is used for the resistance change memory element. However, for the resistance change memory element, for example, a resistive random access memory (ReRAM) element or a conductive bridge random access memory (CBRAM) element can be used.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
a memory cell including a resistance change memory element in which a plurality of data values according to resistance are allowed to be set, and a selector element connected to the resistance change memory element in series;
a word line which supplies a select signal for selecting the resistance change memory element by the selector element to the memory cell;
a bit line to which a data signal according to a data value set in the resistance change memory element selected by the selector element is read from the memory cell;
a load circuit connected to the memory cell in series and functioning as a load for the resistance change memory element; and
a comparator circuit which compares a voltage obtained by the load circuit with a plurality of reference voltages.

2. The memory device of claim 1, wherein the load circuit has a nonlinear current-voltage characteristic.

3. The memory device of claim 1, wherein the load circuit has a logarithmic current-voltage characteristic.

4. The memory device of claim 1, wherein the load circuit has a linear current-voltage characteristic.

5. The memory device of claim 1, wherein the load circuit includes a two-terminal element having a nonlinear current-voltage characteristic.

6. The memory device of claim 5, wherein the two-terminal element is a diode.

7. The memory device of claim 1, wherein the load circuit includes a diode-connected three-terminal element.

8. The memory device of claim 1, wherein the load circuit includes a resistor element.

9. The memory device of claim 1, wherein a plurality of resistance states according to a fall speed of an applied voltage are allowed to be set in the resistance change memory element.

10. The memory device of claim 1, wherein the resistance change memory element is a phase change memory (PCM) element, an interfacial phase change memory (iPCM) element, a resistive random access memory (ReRAM) element or a conductive bridge random access memory (CBRAM) element.

11. The memory device of claim 1, wherein the comparator circuit compares a voltage obtained at a connection point between the memory cell and the load circuit with the plurality of reference voltages.

12. The memory device of claim 1, wherein the comparator circuit compares the voltage obtained by the load circuit with the plurality of reference voltages in a transition period before the voltage obtained by the load circuit reaches a constant value.

13. The memory device of claim 1, wherein the comparator circuit compares the voltage obtained by the load circuit with the plurality of reference voltages in a saturated stage after the voltage obtained by the load circuit reaches a constant value.

14. The memory device of claim 1, wherein the comparator circuit includes a plurality of reference voltage generation circuits which generate the plurality of reference voltages, and
each of the reference voltage generation circuits includes a reference resistor element, a reference selector element connected to one end of the reference resistor element in series, and a reference load circuit connected to the other end of the reference resistor element in series and generating corresponding one of the reference voltages.

15. The memory device of claim 14, wherein a circuit including the reference resistor element, the reference selector element and the reference load circuit has a same circuit structure as that of a circuit including the resistance change memory element, the selector element and the load circuit.

16. The memory device of claim 14, wherein a resistance distribution characteristic of the resistance change memory element includes a plurality of resistance distribution characteristic portions corresponding to the data values, respectively, and satisfies a following formula:

$$\log R_{refx-x+1} = (\log R_x + \log R_{x+1})/2$$

where x is a positive integer, and resistance of a center of the $x^{th}$ resistance distribution characteristic portion is $R_x$, and resistance of a center of the $x+1^{th}$ resistance distribution characteristic portion is $R_{x+1}$, and resistance of the reference resistor element having resistance between the resistance $R_x$ and the resistance $R_{x+1}$ is $R_{refx-x+1}$.

* * * * *